United States Patent [19]

Kinoshita

[11] Patent Number: 5,703,469
[45] Date of Patent: Dec. 30, 1997

[54] SYSTEM FOR DETERMINING BATTERY CONDITIONS

[75] Inventor: Naoki Kinoshita, Wako, Japan

[73] Assignee: Honda Giken Kogyo Kabushiki Kaisha, Tokyo, Japan

[21] Appl. No.: 655,767

[22] Filed: May 30, 1996

[30] Foreign Application Priority Data

Jun. 5, 1995 [JP] Japan ................................. 7-138340

[51] Int. Cl.$^6$ .......................... H01M 10/48; G01N 27/416
[52] U.S. Cl. ................................. 320/48; 320/32; 320/35; 324/430; 324/431; 324/432
[58] Field of Search ........................... 320/13, 30, 32, 320/35, 39, 48; 324/426, 427, 430, 431, 432

[56] References Cited

U.S. PATENT DOCUMENTS

| 4,849,700 | 7/1989 | Morioka et al. | 324/427 |
| 5,321,627 | 6/1994 | Reher | 364/483 |
| 5,352,968 | 10/1994 | Reni et al. | 320/35 |
| 5,539,318 | 7/1996 | Sasaki | 324/428 |

FOREIGN PATENT DOCUMENTS

| 4-186180 | 7/1992 | Japan . |
| 5-227671 | 9/1993 | Japan . |
| 5-260674 | 10/1993 | Japan . |
| 5-77790 | 10/1993 | Japan . |

*Primary Examiner*—Peter S. Wong
*Assistant Examiner*—Patrick B. Law
*Attorney, Agent, or Firm*—Armstrong, Westerman, Hattori, McLeland & Naughton

[57] ABSTRACT

Detected values of a voltage and a current of a battery which are supplied from a voltage and current detector are stored in a memory at a plurality of times while the battery is being discharged. A regression line calculator determines an internal resistance and an open-circuit voltage (non-load voltage or electromotive force) of the battery based on the detected values stored in the memory. Even when the battery is in use with the voltage and the current frequency varying while it is being discharged, a memory effect on the battery can be determined from a reduction in the open-circuit voltage and a deterioration of the battery can be determined from an increase in the internal resistance.

16 Claims, 7 Drawing Sheets

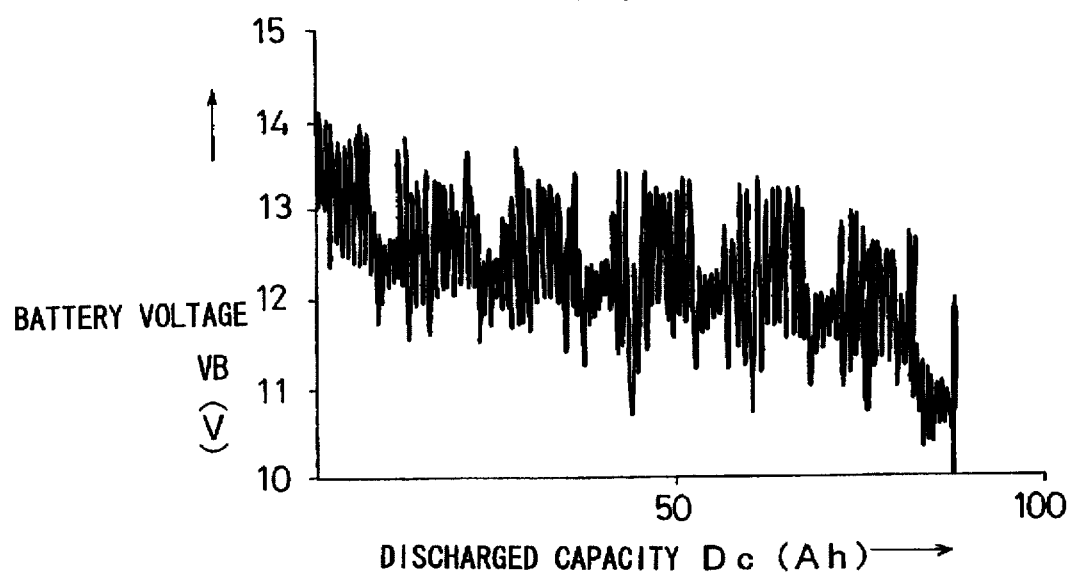

SYSTEM FOR DETERMINING BATTERY CONDITIONS

BACKGROUND OF THE INVENTION

1. Field of the Invention

The present invention relates to a system for determining conditions or states of a nickel-based secondary battery such as a nickel-cadmium secondary battery, a nickel-metal hydride secondary battery, or the like which is mounted as an energy source on an electrically propelled vehicle such as an electric vehicle.

2. Description of the Related Art

The rated power output of an electrically propelled vehicle is defined as its power output when the voltage across a battery mounted on the electrically propelled vehicle is maintained at a predetermined voltage or higher.

As shown in FIG. 10 of the accompanying drawings, a minimum constant voltage of the battery at which the rated power output of an electrically propelled vehicle can be maintained is defined as a discharge ending voltage Vde, and a discharged capacity P=P0 is determined as an allowable discharged capacity which can be used, when the voltage VB of the battery drops to the discharge ending voltage Vde (VB=Vde) after the battery has started being discharged.

The electrically propelled vehicle can keep its rated power output until the battery voltage VB falls to the discharge ending voltage Vde, but can no longer keep its rated power output when the battery voltage VB drops below the discharge ending voltage Vde.

When the electrically propelled vehicle cannot keep its rated power output, certain problems arise as to the feel which the driver of the electrically propelled vehicle has while driving the same. Specifically, when the battery voltage VB drops below the discharge ending voltage Vde, the driver feels that the electrically propelled vehicle does not pick up speed as it used to do even though the driver steps on the accelerator pedal in the same manner as before, and also feels that the electrically propelled vehicle does not produce as much accelerating power as desired even though the driver presses the accelerator pedal deeper.

When the battery voltage VB drops below the discharge ending voltage Vde, causing the above feeling problems, at the time the remaining capacity of the battery decreases as the discharged capacity P increases, the battery usually needs to be replaced with a fresh battery.

Generally, the battery voltage VB drops due to the deterioration of the battery which is brought about by its aging. As well known in the art, the aging-induced deterioration of the battery occurs as the battery is repeatedly charged and discharged resulting in a progressive increase in the internal resistance of the battery and an accompanying reduction in the battery voltage when the battery is under load.

Another cause of a drop in the voltage of a nickel-based secondary battery such as a nickel-metal hydride secondary battery which has a positive electrode of nickel and an alkaline solution is known as a memory effect. The memory effect is a phenomenon in which the battery voltage is lowered stepwise when the battery is deeply discharged after charging and discharging cycles are repeated with a small depth of discharge (DOD).

FIG. 11 of the accompanying drawings shows discharging characteristics of a battery suffering the memory effect, as represented by the solid-line curve for the battery voltage VB=VB1. As can be seen from FIG. 11, when the battery suffers the memory effect, the battery voltage VB1 drops below the discharge ending voltage Vde when the discharged capacity P reaches P=P1, and subsequently the rated power output of an electrically propelled vehicle cannot be maintained. As a consequence, the battery capacity is lowered because the discharged capacity P decreases from the allowable discharged capacity P0 to the allowable discharged capacity P1 by ΔP.

One known technique for preventing a battery from having the memory effect is a so-called reconditioning process for fully discharging the battery until the DOD reaches about 100% before a charging current is supplied to the battery and thereafter starting to charge the battery with the charging current (for details, see Japanese laid-open patent publication No. 5-227671). The reconditioning process is effective to prevent the battery voltage from being lowered stepwise due to the memory effect.

Batteries for use on electrically propelled vehicles have a large capacity of about 20 kWh, for example. If it is assumed that such a battery has an effective service capability of about a DOD of 50% after it is fully charged (a DOD of 0%), the remaining capacity (remaining stored energy) of the battery is of about 10 kW. When the battery is discharged by the reconditioning process each time it is to be charged, it takes at least two hours to discharge the battery even with a discharging system of 4 kW class. The discharging time of two hours and an additional charging time required make it impractical to charge the battery according to the reconditioning process. Another problem is that if the battery is simply discharged, then the remaining stored energy of about 10 kW is only wasted.

It has therefore been recognized that it is efficient to charge batteries for use on electrically propelled vehicles by carrying out the reconditioning process only when the memory effect is detected on the batteries.

Various attempts have heretofore been made to detect the memory effect on batteries.

According to Japanese laid-open utility model publication No. 5-77790, an integrated value of the discharged capacity after the battery is fully charged and until the battery voltage drops to a predetermined battery voltage is determined, and the battery is determined as having the memory effect when the integrated discharged capacity becomes smaller than a rated discharged capacity. This proposal is equivalent to the detection of the memory effect according to the discharging characteristics shown in FIG. 11 in which the rated discharged capacity is regarded as the allowable discharged capacity P0 and the integrated discharged capacity smaller than the rated discharged capacity as the discharged capacity P1.

According to Japanese laid-open patent publication No. 4-186180, the battery voltage is sampled at constant intervals of time when it is discharged, and the memory effect is detected as occurring when the battery voltage sharply drops at a second time (t2 in FIG. 11) after it has sharply dropped at a first time (t1 in FIG. 11).

According to Japanese laid-open patent publication No. 5-260674, the gradient of a battery voltage curve when the battery is discharged is calculated, and the memory effect is detected as occurring when the battery voltage curve has a second sharp gradient (in the vicinity of the time t2 in FIG. 11) after it has had a first sharp gradient (in the vicinity of the time t1 in FIG. 11) within a certain period of time after the battery has started to be discharged.

The above conventional processes of detecting the memory effect have been proposed as being applied to radio communication devices, liquid crystal display units, and battery chargers in which the battery voltage varies relatively moderately or rather statically.

FIG. 12 of the accompanying drawings shows how the voltage of a battery on an electric vehicle varies when the electric vehicle runs in a town mode. As can be understood from FIG. 12, the current discharged from the battery largely varies depending on the depression of the accelerator pedal or the so-called accelerator opening, and hence the battery voltage also dynamically varies. Therefore, the memory effect on the batteries on electrically propelled vehicles cannot accurately be detected by the conventional processes of detecting the memory effect based on static changes in the battery voltage.

There has been a demand for a detecting technique which can distinguish between a voltage drop due to the memory effect on a battery on an electrically propelled vehicle and a voltage drop due to a deterioration of the battery while the battery voltage is dynamically varying. However, no such detecting process has been proposed so far.

SUMMARY OF THE INVENTION

It is an object of the present invention to provide a system for detecting a memory effect on a battery and a deterioration of the battery while the battery is being discharged in use with its current and voltage frequently varying.

Another object of the present invention is to provide a system for detecting a deterioration of a battery while the battery is being discharged in use with its current and voltage frequently varying.

Still another object of the present invention is to provide a system for detecting a memory effect on a battery while the battery is being discharged in use with its current and voltage frequently varying.

The above and other objects, features, and advantages of the present invention will become more apparent from the following description when taken in conjunction with the accompanying drawings in which a preferred embodiments of the present invention is shown by way of illustrative example.

BRIEF DESCRIPTION OF THE DRAWINGS

FIG. 12 is a diagram showing how the voltage of a battery on an electrically propelled vehicle varies when the electrically propelled vehicle runs in a town mode.

DETAILED DESCRIPTION OF THE PREFERRED EMBODIMENT

Figure 9:
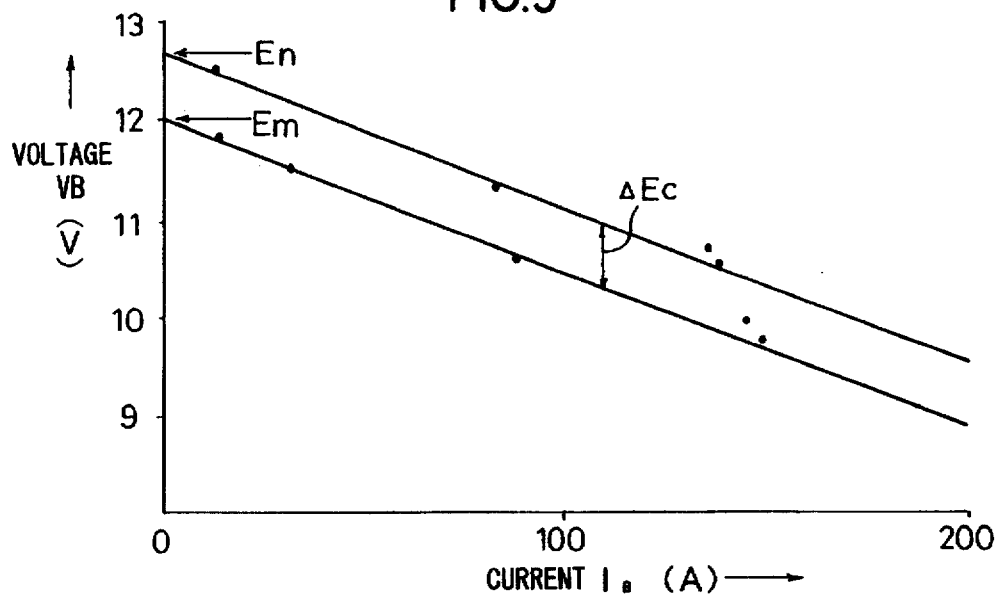
FIG. 9 is a diagram showing regression lines calculated with a DOD of 70% in FIG. 8.
Figure 10:
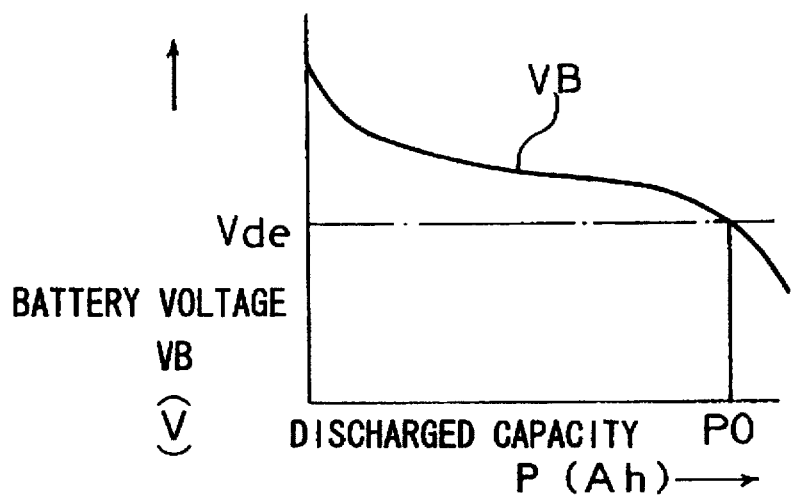
FIG. 10 is a diagram of discharging characteristics of a battery when it is normal.
Figure 11:
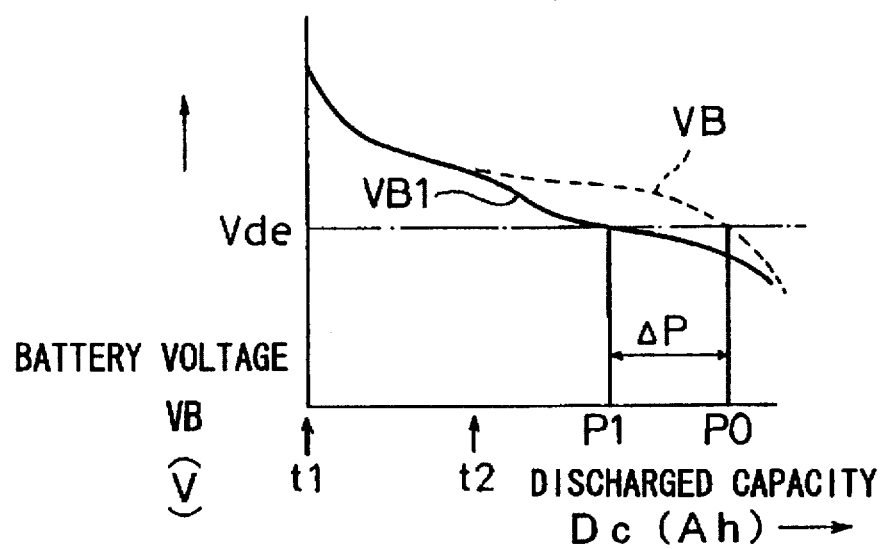
FIG. 11 is a diagram of discharging characteristics of a battery when it suffers the memory effect.

Those parts or concepts shown in FIGS. 1 through 9 which are identical to those shown in FIGS. 10 through 12 are denoted by identical reference characters, and will not be described in detail below. FIGS. 10 through 12 will also be referred to when necessary in the description of the embodiment of the present invention.

Figure 1:
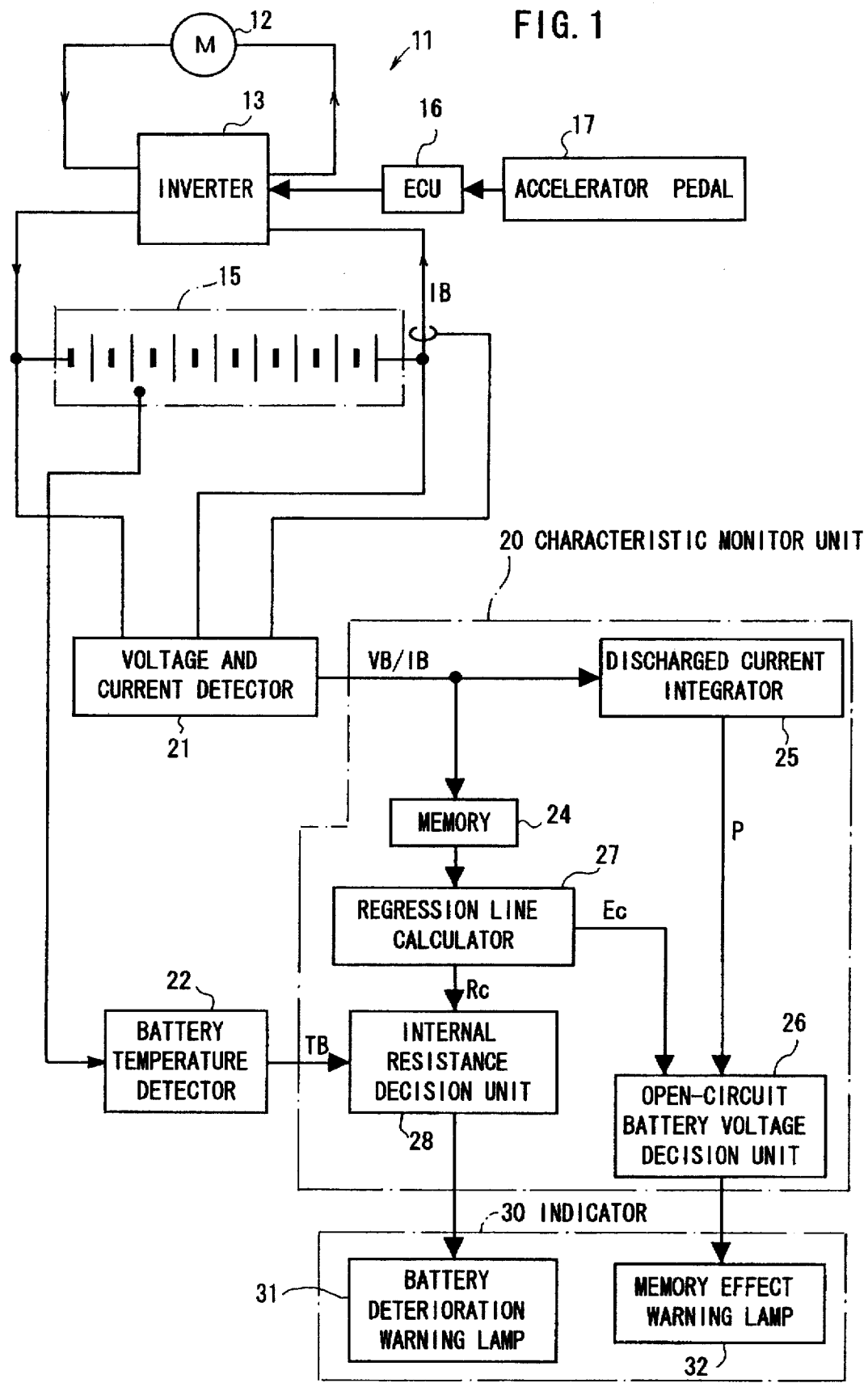
FIG. 1 is a block diagram of an electrically propelled vehicle which incorporates a battery condition detecting system according to the present invention.

FIG. 1 shows in block form an electrically propelled vehicle 11 which incorporates a battery condition detecting system according to the present invention.

The electrically propelled vehicle 11 has a three-phase alternating-current motor 12 as a propulsive power unit thereof. The motor 12 is supplied with electric energy from a secondary battery 15 as an energy source through an inverter 13. The power output generated by the motor 12 is controlled by an electronic control unit (ECU) 16 which serves as a running control means for controlling the duty ratio of the inverter 13. The ECU 16 has an input port supplied with a voltage commensurate with the depth to which an accelerator pedal 17 is pressed. The ECU 16 controls the duty ratio of the inverter 13 depending on the voltage applied to the input port of the ECU 16. Even though the duty ratio of the inverter 13 is controlled by the ECU 16, the motor 12 is unable to produce a rated power output when a battery voltage VB of the battery 15 drops below a discharge ending voltage Vde shown in FIG. 10.

The ECU 16 comprises a microcomputer, for example, which has a microprocessor unit (MPU) corresponding to a central processing unit (CUP), (analog-to-digital) A/D and (digital-to-analog) D/A converters connected as input and output circuits to the microprocessor unit, an I/O port, a read-only memory (ROM) which stores a system program, etc., a random-access memory (RAM) for temporarily storing processed data, a timer circuit, and an interrupt processing circuit, which are integrated in a one-chip LSI device.

The battery 15 on the electrically propelled vehicle 11 comprises a nickel-metal hydride secondary battery which is of a small size, can produce a high energy output, and has a high storage capacity, though it suffers the memory effect, i.e., its voltage sharply drops in an initial discharge stage after it is repeatedly charged and discharged with a small DOD. The battery 15 is composed of 20, for example, series-connected unit cells each having a rated voltage of 12 V.

A voltage across the battery 15 and a current IB supplied from the battery 15 to the inverter 13 are detected by a voltage and current detector (voltage and current sensors) 21. The voltage and current detector 21 outputs a voltage (voltage data) VB per unit cell of the battery 15 and a current (current data) IB. The voltage VB is a voltage obtained by dividing the voltage across the battery 15 by the number of the cells.

A temperature (temperature data) TB of the battery 15 is detected by a battery temperature detector 22. Actually, the battery temperature detector 22 comprises a detector (a voltmeter, an ammeter, and a thermometer) for detecting an analog signal, and a A/D converter for converting the electric analog signal detected by the detector into digital data.

The voltage VB and the current IB are supplied to a memory 24 in a characteristic monitor unit 20 which comprises a microcomputer. The current IB is also supplied to a discharged current integrator 25. The memory 24, which may comprise a semiconductor RAM or the like, successive values of the voltage VB and the current IB at successive times each of 1 second in this embodiment. The characteristic monitor unit 20 may be combined with the ECU 16.

The discharged current integrator 25 calculates an integrated value $\Sigma$ (IB×$\Delta$h) of products IB×$\Delta$h of the current IB and a time $\Delta$h (e.g., 1 second), i.e., a discharged capacity P, and supplies the discharged capacity P to one of the input terminals of an open-circuit battery voltage decision unit 26. If it is assumed that the battery 15 has an equivalent circuit comprising a resistor and an ideal battery, then an open-circuit battery voltage Ec is a voltage across an ideal battery, and is also referred to as a battery electromotive force.

A regression line calculator 27 calculates a regression line (described later on) from the group of data of the voltage VB and the current IB read from the memory 24, and supplies an open-circuit battery voltage Ec derived from the regression line to the other input terminal of the open-circuit battery voltage decision unit 26 and also supplies an interval resistance Rc derived from the regression line to one of the input terminals of an internal resistance decision unit 28.

The other input terminal of the internal resistance decision unit 28 is supplied with the battery temperature TB from the battery temperature detector 22. Depending on the decision made by the internal resistance decision unit 28, a battery deterioration warning lamp 31 of an indicator 30 is turned on. The open-circuit battery voltage decision unit 26 applies an output signal to turn on a memory effect warning lamp 32 of the indicator 30.

Figure 2:
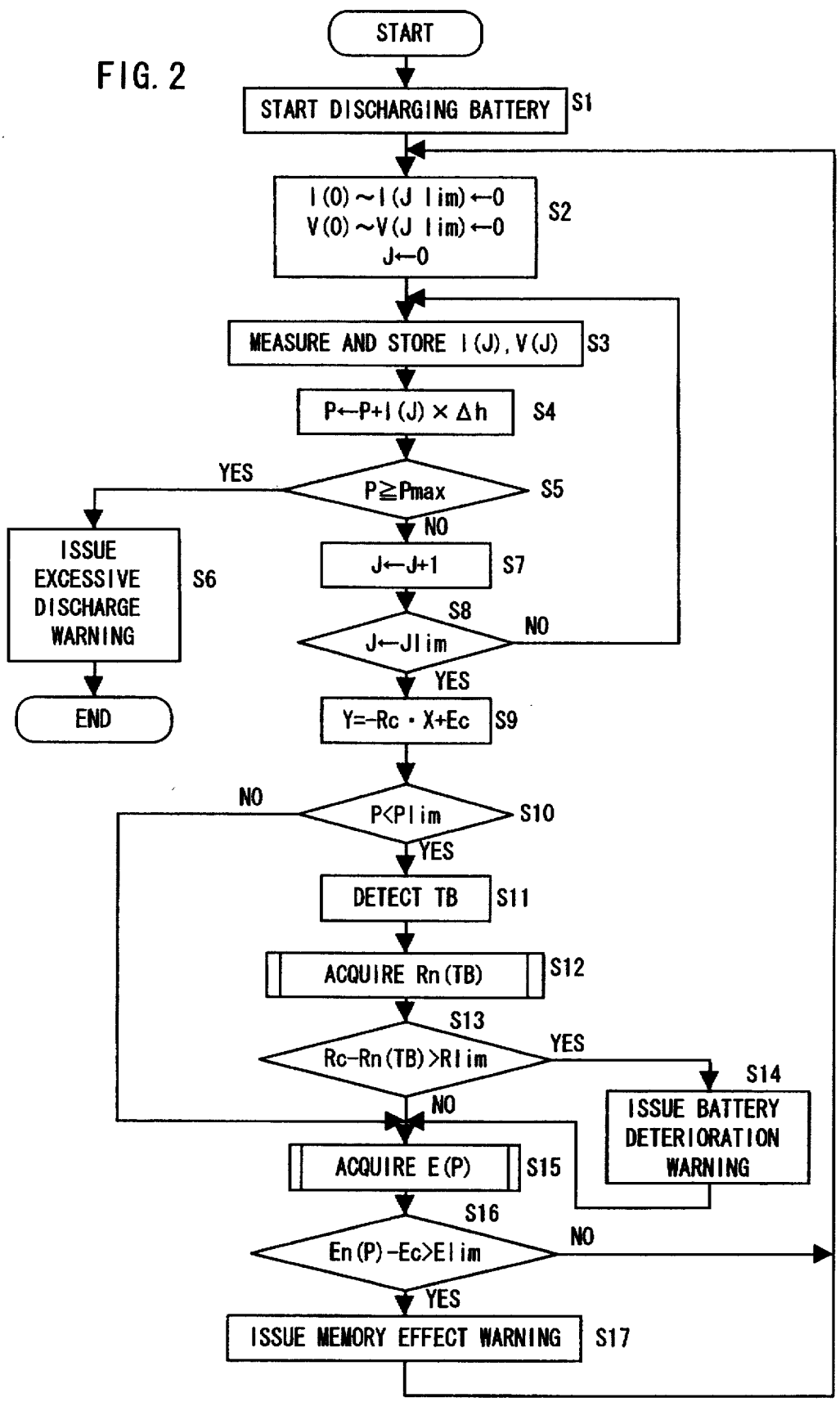
FIG. 2 is a flowchart of an operation sequence of the battery condition detecting system according to the present invention.

An operation sequence of the battery condition detecting system according to the present invention will be described below with reference to FIG. 2.

The battery 15 starts supplying the current IB through the inverter 13 to the motor 12, i.e., the battery 15 starts being discharged in a step S1. Thereafter, any data stored in the memory 24 are erased in a step S2. Specifically, stored memory data I(J) {=I(0), I(1), ... , I(Jlim)} of the current IB and stored memory data V(J) {=V(0), V(1), ... , V(Jlim)} of the voltage VB where J represents addresses of the memory 24 are cleared to zero, and the parameter J is set to 0 (J←0). The parameter J may take a value ranging from 0, 1, ... , Jlim.

While the battery 15 is being discharged, voltage data VB and the current data IB which are produced by the voltage and current detector 21 at certain intervals $\Delta$h of time, each of 1 second, for example, are stored as current memory data I(J)=I(0) and voltage memory data V(J)=V(0) in the memory 24 in a step S3.

At the same time, the discharged current integrator 25 calculates an integrated value of the discharged current, i.e., a discharged capacity (ampere-hour) P, according to the following equation (1), and supplies the discharged capacity P to the open-circuit battery voltage decision unit 26 in a step S4:

$$P \leftarrow P + I(J) \times \Delta h \qquad (1)$$

Then, it is decided whether the discharged capacity P calculated according to the equation (1) is equal to or in excess of a predetermined discharged capacity Pmax in a step S5. The predetermined discharged capacity Pmax may be set to a discharged capacity with a DOD of 90%, for example. If the discharged capacity P is equal to or in excess of the predetermined discharged capacity Pmax in the step S5, an excessive discharging condition warning is issued in a step S6, waiting for a command from the user to stop using the battery 15. Then, an end is put to the operation sequence shown in FIG. 2. The excessive discharging condition warning may be given by shifting the pointer of a fuel indicator toward an empty (E) side, and may alternatively be produced an indicator lamp, a voice sound, or a buzzer.

After elapse of 1 second, the parameter J is incremented by 1 to J←J+1 in a step S7, and it is decided whether the number of the memory data I(J), V(J) has reached a predetermined value (Jlim) or not in a step S8. The steps S3–S8 are repeated to acquire memory data I(J), V(J) until the number of the memory data I(J), V(J) reaches the predetermined value (Jlim).

Figure 3:
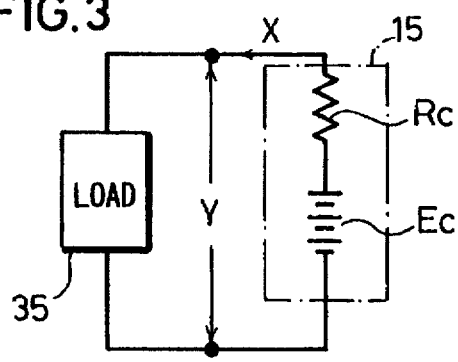
FIG. 3 is a circuit diagram of an equivalent circuit of a battery and a load on the battery.

If the number of the memory data I(J), V(J) reaches the predetermined value (Jlim) in the step S8, then a regression line is determined in a step S9 based on the definition that a current supplied to a load 35 (see FIG. 3) composed of the inverter 3 and the motor 12 is represented by X and a voltage across the battery 15 (a voltage across each of the unit cells in actual calculations) is represented by Y. In FIG. 3, the battery 15 has an open-circuit voltage (non-load voltage or electromotive force) Ec which is an ideal voltage, and an internal resistance Rc (i.e., an internal resistance of each of the unit cells). Actually, the load 35 on the battery 15 also includes an air-conditioning unit comprising a motor-driven compressor.

In FIG. 3, the voltage Y, the current X, the internal resistance Rc, and the open-circuit voltage Ec are related to each other according to the following equation (2):

$$Y = Ec - Rc \cdot X = -Rc \cdot X + Ec \qquad (2)$$

Figure 4:
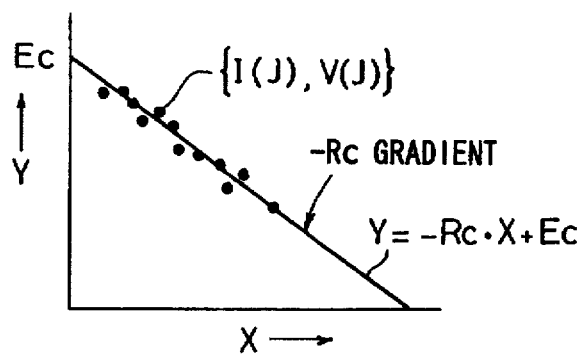
FIG. 4 is a diagram of a regression line.

FIG. 4 shows the relationship between the memory data I(J), V(J) and the equation Y (voltage Y). The equation Y is determined with respect to the memory data I(J), V(J) according to a regression analysis. According to the regression analysis, the internal resistance Rc which indicates the gradient of the equation Y is determined by the equation (3), see below, and the open-circuit voltage Ec which is a Y-intercept of the equation Y is determined by the equation (4), see below. In this embodiment, the memory data I(J), V(J) comprise 60 (Jlim=59) sets of data obtained when the voltage VB and the current IB are sampled every second for 1 minute. The regression analysis is carried out based on the 60 sets of data.

$$Rc = -\{Jlim \times \Sigma I(J) \cdot V(J)\} + \{Jlim \times \Sigma I(J)^2 - (\Sigma I(J))^2\} \qquad (3)$$

$$Ec = \{\Sigma I(J)^2 \times \Sigma V(J) - \Sigma I(J) \times \Sigma I(J) \cdot V(J)\} + \{Jlim \times \Sigma I(J)^2 - (\Sigma I(J))^2\} \qquad (4)$$

Then, it is decided in a step S10 whether the present discharged capacity P calculated in the step S4 has reached a predetermined discharged capacity Plim corresponding to a relatively large DOD, e.g., a DOD of 80%, or not.

If the present discharged capacity P has not reached the predetermined discharged capacity Plim, stated otherwise, if the DOD is relatively small, (step S10: YES), then since the internal resistance Rc is constant regardless of the DOD, control jumps from the step S10 to a step S15 for starting a process of detecting a memory effect. If the present discharged capacity P has reached the predetermined discharged capacity Plim, indicating a large DOD, then since the internal resistance Rc sharply increases, it is impossible to decide whether the battery has deteriorated or not (step S10: NO). Therefore, control goes from the step S10 to a step S11 for starting a process of detecting a deterioration of the battery 15.

In the process of detecting a deterioration of the battery 15, the battery temperature TB detected by the battery temperature detector 22 is read into the internal resistance decision unit 28 in a step S11.

Then, a non-deteriorated internal resistance Rn(TB) of the battery 15 when it is not deteriorated (also referred to as a new-battery internal resistance) at the battery temperature TB is read from a temperature vs. non-deteriorated internal resistance table which was prepared when the battery 15 is new or non-deteriorated in a step S12.

Figure 5:
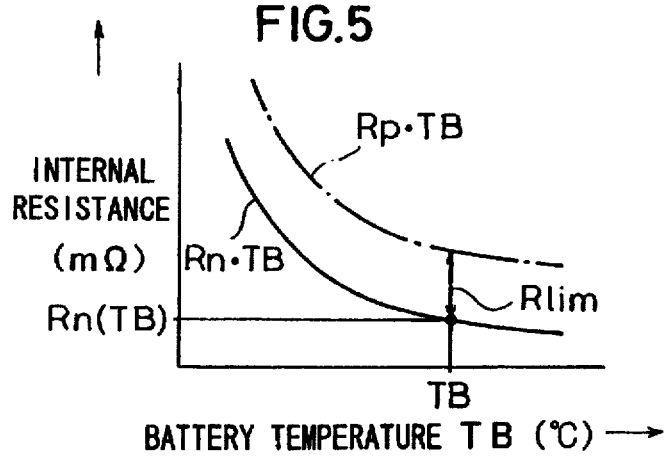
FIG. 5 is a diagram showing how the internal resistance of the battery varies with respect to the temperature of the battery.

In FIG. 5, the solid-line curve equivalently represents a temperature vs. non-deteriorated internal resistance table Rn·TB, and the dot-and-dash-line curve equivalently represents a temperature vs. deteriorated internal resistance table Rp·TB. It can be seen from FIG. 5 that the internal resistance Rc becomes larger as the battery temperature TB becomes lower and the service life of the battery becomes shorter. The temperature vs. non-deteriorated internal resistance table Rn·TB is stored in a ROM (not shown) in the internal resistance decision unit 28.

Figure 6:
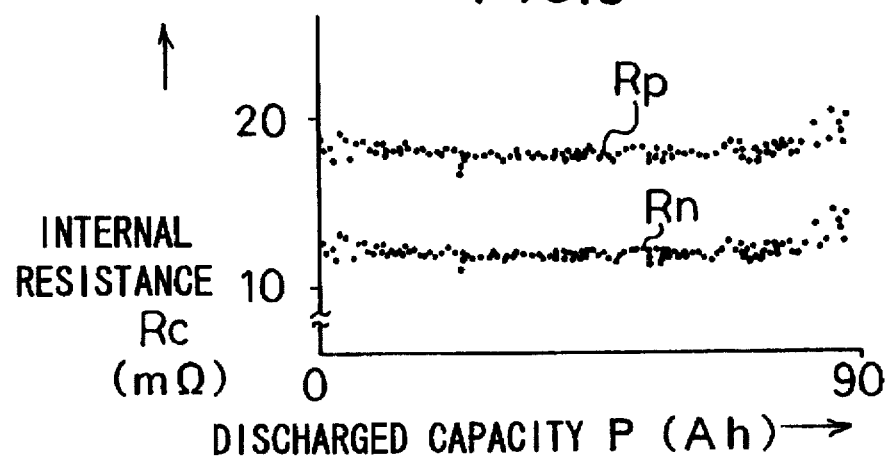
FIG. 6 is a diagram showing how the internal resistance of the battery varies with respect to the discharged capacity of the battery.

FIG. 6 shows the relationship between the internal resistance Rc measured at normal temperature and the discharged capacity P for a plurality of batteries 15. A study of FIG. 6 indicates that except for a final discharging stage in which the DOD is about 90% or greater, the internal resistance Rc, specifically, the non-deteriorated internal resistance Rn and the deteriorated internal resistance table Rp, are substantially constant independently of the charged capacity P.

In the step S12, the non-deteriorated internal resistance Rn(TB) corresponding to the battery temperature TB read in the step S11 is read from the temperature vs. non-deteriorated internal resistance table Rn·TB.

Thereafter, a difference {Rc−Rn(TB)} between the present internal resistance Rc and the non-deteriorated internal resistance Rn(TB) is determined, and it is decided whether the difference {Rc−Rn(TB)} exceeds a reference resistance Rlim or not in a step S13.

As shown in FIG. 5, the reference resistance Rlim is obtained as the difference between the non-deteriorated internal resistance Rn and the deteriorated internal resistance table Rp at the battery temperature TB. The reference resistance Rlim has almost no dependency on the temperature, and is uniquely determined once specifications of the battery 15 to be used are given. However, the reference resistance Rlim may be varied depending on the temperature for greater accuracy.

If the difference {Rc−Rn(TB)} exceeds the reference resistance Rlim in the step S13, then since the internal resistance of the battery 15 is large, the battery 15 is judged as being deteriorated, and the battery deterioration warning lamp 31 is turned on in a step S14.

The deterioration of the battery 15 may be indicated by a voice sound or a buzzer instead of the battery deterioration warning lamp 31. Once the difference {Rc−Rn(TB)} exceeds the reference resistance Rlim in the step S13, the deterioration of the battery 15 may be indicated continuously until the battery 15 is replaced with a new one. The battery deterioration warning lamp 31 may be replaced with an electromechanical structure for keeping a warning color indication so that undue electric energy will not be consumed to continue the battery deterioration warning.

If the present discharged capacity P has reached the predetermined discharged capacity Plim, i.e., if the DOD is relatively large, then control jumps to the step S15 for starting the process of detecting a memory effect. In this embodiment, control also goes from the step S14 to the process of detecting a memory effect. However, the operation sequence shown in FIG. 2 may be modified to cause the processing to return from the step S14 back to the step S2.

In the step S15, an open-circuit voltage En(P) of the battery under normal conditions, i.e., without any memory effect, is obtained from a predetermined discharged capacity vs. normal open-circuit voltage table.

Figure 7:
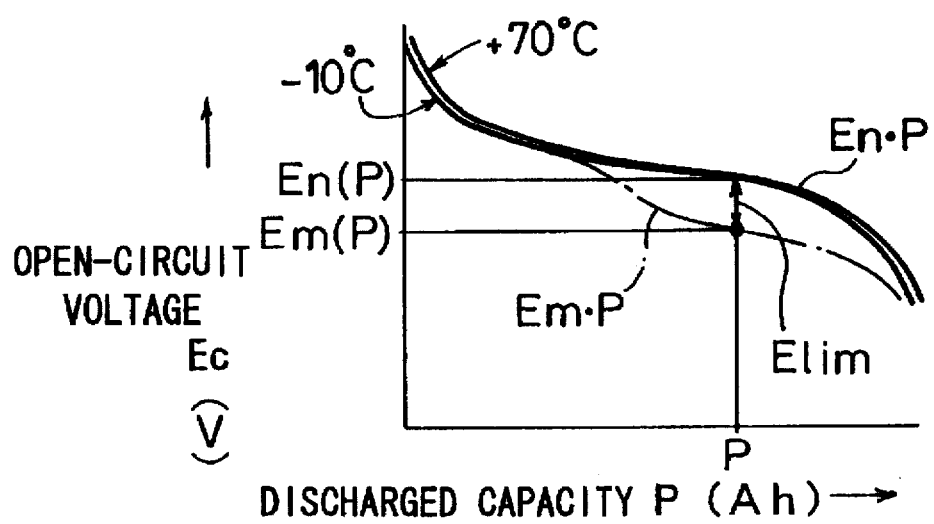
FIG. 7 is a diagram showing how the open-circuit voltage of the battery varies with respect to the discharged capacity of the battery.

FIG. 7 shows two solid-line curves equivalently representing discharged capacity vs. normal open-circuit voltage tables En·P with the open-circuit voltage Ec=En and no memory effect occurring when the temperatures is −10° C. and +70° C., respectively, and a dot-and-dash-line curve representing a discharged capacity vs. normal open-circuit voltage table Em·P with the open-circuit voltage Ec=Em and a memory effect occurring. The discharged capacity vs. normal open-circuit voltage tables En·P are stored in a ROM (not shown) in the open-circuit battery voltage decision unit 26.

It can be understood from FIG. 7 that the normal open-circuit voltage En with respect to the discharged capacity P calculated in the step S4 is not affected by the temperature in the temperature range from −10° C. to +70° C. in which the electrically propelled vehicle 11 is used. Stated otherwise, it is not necessary to take into account the temperature for detecting the occurrence of a memory effect. The normal open-circuit voltage En with respect to the discharged capacity P is obtained as En=En (P) from the discharged capacity vs. normal open-circuit voltage tables En·P shown in FIG. 7.

Then, a difference {E(P)−Ec} between the open-circuit battery voltage En(P) as a normal reference voltage under normal conditions and the present open-circuit battery voltage Ec obtained as a result of the regression analysis is determined, and it is decided whether the difference {E(P)−Ec} exceeds a predetermined voltage difference Elim in a step S16. The predetermined voltage difference Elim is obtained as the difference between the open-circuit battery voltage En(P) and the open-circuit battery voltage Em(P) at which the battery is suffering a memory effect. Actually, the voltage difference Elim is determined with a slight margin. As with the reference resistance Rlim, the voltage difference Elim has almost no dependency on the temperature.

Figure 8:
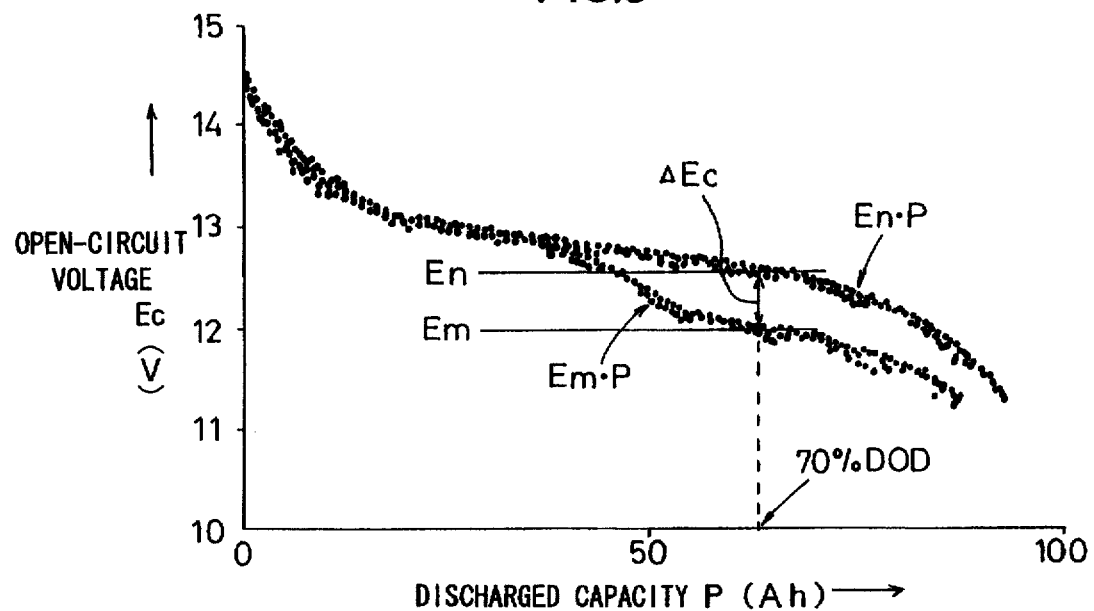
FIG. 8 is a diagram showing how the open-circuit voltage of the battery varies with respect to the discharged capacity of the battery before and after 60 charging and discharging cycles are repeated with a DOD of 50%.

FIG. 8 shows measured values of the open-circuit voltage Ec plotted in 60 repeated cycles of using a unit cell having a rated voltage of 12 V for use in a nickel-metal hydride secondary battery and thereafter fully charging the unit cell at the battery temperature TB of 25° C. In FIG. 8, the plotted values represent a characteristic curve En·P under normal conditions before a memory effect occurs and a characteristic curve Em·P after a memory effect occurs. When the DOD is 70%, for example, the open-circuit voltage Em when the battery suffers a memory effect is lower by a voltage drop ΔEc than the open-circuit voltage En under normal conditions.

FIG. 9 shows regression lines calculated with a DOD of 70% in FIG. 8 before and after the cycle test.

The voltage VB (corresponding to the voltage Y in FIG. 3) at the time the current IB is IB=0(A) is the open-circuit voltage Ec. When the battery 15 is under normal conditions, the open-circuit voltage Ec is calculated as Ec=En=12.7 (V). When the battery 15 suffers a memory effect, the open-circuit voltage Ec is calculated as Ec=Em=12.0 (V), with the voltage drop ΔEc being ΔEc=0.7 (V). When the battery 15 is under normal conditions or suffers a memory effect, the internal resistance Rc is Rc=16 (mΩ).

If the difference {E(P)−Ec} exceeds the predetermined voltage difference Elim in the step S16, indicating that the occurrence of a memory effect is detected, then the memory effect warning lamp 32 is turned on in a step S17. The memory effect warning may be given by an indicator, a voice sound, or a buzzer. Once the difference {E(P)−Ec} exceeds the predetermined voltage difference Elim in the step S16, the memory effect of the battery 15 may be indicated continuously until the battery 15 is fully discharged. The memory effect warning lamp 32 may be replaced with an electromechanical structure for keeping a warning color indication so that undue electric energy will not be consumed to continue the battery deterioration warning.

If the occurrence of a memory effect is not detected (step S16: NO), or after the memory effect warning has been issued in the step S17, control returns to the step 2 for newly carrying out the process of detecting a deterioration of the battery 15 and the process of detecting a memory effect, and these processes are repeated. However, once the memory effect warning has been issued, the process of detecting a memory effect may be dispensed with.

In this embodiment, the regression line Y (see FIG. 4) for the group of memory data {I(J), V(J)} produced by sampling the voltage VB and the current IB at a relatively high rate is uniquely calculated from conditions (the charged capacity P and the temperature TB) of the battery 15. Therefore, the internal resistance Rc and the open-circuit battery voltage Ec which depend on the temperature TB can easily be calculated even if the voltage VB and the current IB are frequently varied.

Furthermore, the open-circuit voltage Ec calculated at a certain DOD and the open-circuit voltage En(P) (see FIG. 7) under normal conditions which is a predetermined reference voltage under normal conditions free from any memory effect are compared with each other {En(P)−Ec>Elim} to reliably detect the occurrence of a memory effect.

Moreover, based on the fact that when the battery 15 is deteriorated, the internal resistance Rc thereof increases (see FIG. 5), the internal resistance Rc of the battery 15 which has been determined from the regression line Y and the reference internal resistance Rn(TB) under normal conditions which has been experimentally determined and corresponds to the battery temperature TB are compared with each other {Rc−Rn(TB)>Rlim} to reliably detect a deterioration of the battery 15.

The user can recognize the need for replacement of the battery 15 by visually checking the battery deterioration warning lamp 31.

The user can also recognize that the performance of the battery 15 can be restored when the battery 15 is fully discharged, and that the distance which the electrically propelled vehicle 11 can travel and the maximum accelerating power of the electrically propelled vehicle 11 is lowered, by visually checking the memory effect warning lamp 32. When the memory effect warning lamp 32, contents of the memory effect warning and instructions that can be made for the memory effect warning may be displayed on a display unit with the aid of a help function.

In the above embodiment, a reduction in the performance of the battery 15 can be detected as being caused by either a reduction in the service life of the battery 15 or the occurrence of a memory effect on the battery 15, and both a reduction in the service life of the battery 15 and the occurrence of a memory effect on the battery 15 can simultaneously be detected. When the performance of the battery 15 is reduced by a reduction in the service life of the battery 15, the initial performance of the battery 15 cannot be restored even by fully discharging the battery 15. Only when the battery 15 suffers a memory effect, the battery 15 may be reconditioned by a full discharge to regain the initial performance of the battery 15. In this manner, it is possible to eliminate a loss of energy and an excessive working time which would otherwise take place if the battery 15 were unnecessarily discharged. This offers an advantage over the conventional processes which fail to distinguish between a reduction in the performance of the battery 15 caused by a deterioration the battery 15 and a reduction in the performance of the battery 15 caused by the occurrence of a memory effect on the battery 15.

The electrically propelled vehicle may be any of various vehicles including electric vehicles, motorcycles, trucks, buses, etc.

With the arrangement of the present invention, as described above, detected values of a battery from the voltage and current sensors are stored in the memory at a plurality of times while the battery is being discharged, and an internal resistance and/or an open-circuit voltage of the battery is calculated by a processing means based on the detected values stored in the memory. Therefore, a deterioration of the battery can be determined on the basis of the calculated internal resistance of the battery, and a memory effect of the battery can also be determined on the basis of the calculated open-circuit voltage of the battery.

Furthermore, when a deterioration of the battery and a memory effect of the battery are determined on the processing means, the determined results are indicated on the indicator. Consequently, the user can visually recognize readily and accurately the times when a deterioration of the battery and a memory effect of the battery are determined.

In addition, the internal resistance and the open-circuit voltage of the battery are determined by the processing means according to a regression line which is obtained based on the detected values stored in the memory. Thus, a memory effect of the battery and/or a deterioration of the battery can be detected according to a regression analysis while the battery is in use with its current and voltage frequently varying. The principles of the present invention are particularly suitable when incorporated in an electrically propelled vehicle in which the current outputted from a battery is frequently varied depending on the depression of an accelerator pedal.

Although a certain preferred embodiment of the present invention has been shown and described in detail, it should be understood that various changes and modifications may be made therein without departing from the scope of the appended claims.

What is claimed is:

1. A system for determining conditions of a nickel-based secondary battery mounted as a power unit on an electrically propelled vehicle, comprising:

a voltage sensor for detecting a voltage across the battery;

a current sensor for detecting a current flowing from the battery to a load;

a memory for storing the detected values of the voltage and current from said voltage sensor and said current sensor at a plurality of times while the battery is being discharged; and processing means for calculating an internal resistance and an open-circuit voltage of the battery based on the detected values stored in said memory, determining a deterioration of the battery based on the internal resistance, and determining a memory effect on the battery based on the open-circuit voltage.

2. A system according to claim 1, further comprising an indicator for indicating the deterioration of the battery and the memory effect on the battery when the deterioration of the battery and the memory effect on the battery are determined by said processing means.

3. A system according to claim 1, wherein said processing means comprises means for determining the internal resistance and the open-circuit voltage of the battery according to a regression line equation which is obtained based on the detected values stored in said memory.

4. A system according to claim 1, wherein said processing means comprises means for determining the internal resistance and an open-circuit voltage of the battery according to a regression line equation which is obtained based on the detected values stored in said memory, further comprising an indicator for indicating the deterioration of the battery and the memory effect on the battery when the deterioration of the battery and the memory effect on the battery are determined by said processing means.

5. A system according to claim 1, further comprising a discharged current integrator for integrating a discharged capacity of the battery, wherein said processing means comprises means for determining only the memory effect on the battery if the discharged capacity integrated by said discharged current integrator has not reached a predetermined discharged capacity, and determining both the deterioration of the battery and the memory effect on the battery if the discharged capacity integrated by said discharged current integrator has reached the predetermined discharged capacity.

6. A system according to claim 1, further comprising a temperature sensor for detecting a temperature of the battery, wherein said processing means comprises means for determining the deterioration of the battery based on the internal resistance with respect to the detected temperature by referring to a table of battery temperatures and non-deteriorated internal resistances which have been measured.

7. A system according to claim 1, further comprising a temperature sensor for detecting a temperature of the battery, wherein said processing means comprises means for determining the internal resistance according to a regression line equation which is obtained based on the detected values stored in said memory, and determining the deterioration of the battery based on the determined internal resistance with respect to the detected temperature by referring to a table of battery temperatures and non-deteriorated internal resistances which have been measured.

8. A system according to claim 1, wherein each of said plurality of times occurs at an interval of 1 second, and said processing means comprises means for calculating a regression line equation based on a plurality of detected values stored in said memory each time 60 sets of detected values are stored in said memory, and determining the internal resistance of the battery and the open-circuit voltage of the battery according to the calculated regression line equation.

9. A system for determining conditions of a nickel-based secondary battery mounted as a power unit on an electrically propelled vehicle, comprising:

a voltage sensor for detecting a voltage across the battery, a current sensor for detecting a current flowing from the battery to a load;

a memory for storing the detected values of the voltage and current from said voltage sensor and said current sensor at a plurality of times while the battery is being discharged; and processing means for calculating an internal resistance of the battery based on the detected values stored in said memory, and determining a deterioration of the battery based on the internal resistance.

10. A system according to claim 9, wherein said processing means comprises means for determining the internal resistance of the battery according to a regression line equation which is obtained based on the detected values stored in said memory.

11. A system according to claim 9, further comprising a temperature sensor for detecting a temperature of the battery, wherein said processing means comprises means for determining the deterioration of the battery based on the internal resistance with respect to the detected temperature by referring to a table of battery temperatures and non-deteriorated internal resistances which have been measured.

12. A system according to claim 9, further comprising a temperature sensor for detecting a temperature of the battery, wherein said processing means comprises means for determining the internal resistance according to a regression line equation which is obtained based on the detected values stored in said memory, and determining the deterioration of the battery based on the determined internal resistance with respect to the detected temperature by referring to a table of battery temperatures and non-deteriorated internal resistances which have been measured.

13. A system according to claim 9, wherein each of said plurality of times occurs at an interval of 1 second, and said processing means comprises means for calculating a regression line equation based on a plurality of detected values stored in said memory each time 60 sets of detected values are stored in said memory, and determining the internal resistance of the battery according to the calculated regression line equation.

14. A system for determining conditions of a nickel-based secondary battery mounted as a power unit on an electrically propelled vehicle, comprising:

a voltage sensor for detecting a voltage across the battery, a current sensor for detecting a current flowing from the battery to a load;

a memory for storing the detected values of the voltage and current from said voltage sensor and said current sensor at a plurality of times while the battery is being discharged; and processing means for calculating an open-circuit voltage of the battery based on the detected values stored in said memory, and determining a memory effect on the battery based on the open-circuit voltage.

15. A system according to claim 14, wherein said processing means comprises means for determining the open-circuit voltage of the battery according to a regression line equation which is obtained based on the detected values stored in said memory.

16. A system according to claim 14, wherein each of said plurality of times occurs at an interval of 1 second, and said processing means comprises means for calculating a regression line equation based on a plurality of detected values stored in said memory each time 60 sets of detected values are stored in said memory, and determining the open-circuit voltage of the battery according to the calculated regression line equation.

* * * * *